(12) United States Patent
Park et al.

(10) Patent No.: US 10,789,448 B2
(45) Date of Patent: Sep. 29, 2020

(54) ORGANIC ELECTRONIC DEVICE AND METHOD OF FABRICATING THE SAME

(71) Applicant: ELECTRONICS AND TELECOMMUNICATIONS RESEARCH INSTITUTE, Daejeon (KR)

(72) Inventors: Young Sam Park, Daejeon (KR); Jaehyun Moon, Daejeon (KR); Seongdeok Ahn, Daejeon (KR); Seung Youl Kang, Daejeon (KR); Sung Haeng Cho, Cheongju (KR); Byoung Gon Yu, Yeongdong (KR); Jeong Ik Lee, Daejeon (KR); Jonghee Lee, Daejeon (KR); Nam Sung Cho, Daejeon (KR); Doo-Hee Cho, Daejeon (KR); Hyunsu Cho, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 88 days.

(21) Appl. No.: 16/035,290

(22) Filed: Jul. 13, 2018

(65) Prior Publication Data
US 2019/0065815 A1 Feb. 28, 2019

(30) Foreign Application Priority Data

Aug. 23, 2017 (KR) .................. 10-2017-0106936
Dec. 11, 2017 (KR) .................. 10-2017-0169604
May 8, 2018 (KR) .................. 10-2018-0052660

(51) Int. Cl.
*G06K 9/00* (2006.01)
*H01L 27/28* (2006.01)
(Continued)

(52) U.S. Cl.
CPC ....... *G06K 9/0004* (2013.01); *G06K 9/00885* (2013.01); *H01L 27/288* (2013.01);
(Continued)

(58) Field of Classification Search
CPC ............. G06K 9/0004; G06K 9/00885; H01L 27/288; H01L 27/322; H01L 51/0097; H01L 51/4253
See application file for complete search history.

(56) References Cited

U.S. PATENT DOCUMENTS 10,461,136 B2 * 10/2019 Zhang ............... H01L 27/3246
10,474,867 B2 * 11/2019 Yeke Yazdandoost ...................... H01L 27/14685
(Continued)

FOREIGN PATENT DOCUMENTS

JP 201556512 A 3/2015
JP 2015228460 A 12/2015
(Continued)

*Primary Examiner* — Utpal D Shah

(57) ABSTRACT

The inventive concept provides an organic electronic device and a method of fabricating the same. The organic electronic device includes a flexible substrate configured to include a first region and a second region which are laterally spaced apart from each other, an organic light-emitting diode disposed in the first region of the flexible substrate, and a photodetector disposed in the second region of the flexible substrate, wherein the organic light-emitting diode and the photodetector are disposed on the same plane.

9 Claims, 6 Drawing Sheets

(51) Int. Cl.
*H01L 51/00* (2006.01)
*H01L 51/44* (2006.01)
*H01L 51/42* (2006.01)
*H01L 51/50* (2006.01)
*H01L 51/52* (2006.01)
*H01L 27/32* (2006.01)

(52) U.S. Cl.
CPC ........ *H01L 27/322* (2013.01); *H01L 51/0097* (2013.01); *H01L 51/428* (2013.01); *H01L 51/4253* (2013.01); *H01L 51/447* (2013.01); *H01L 51/5036* (2013.01); *H01L 51/5268* (2013.01); *G06K 2009/00932* (2013.01); *H01L 2251/5338* (2013.01)

(56) References Cited

U.S. PATENT DOCUMENTS

| | | |
|---|---|---|
| 2014/0334671 A1 | 11/2014 | Lee et al. |
| 2016/0020415 A1 | 1/2016 | Yagi et al. |
| 2016/0041663 A1* | 2/2016 | Chen ............... G06F 3/0412 345/174 |
| 2016/0146987 A1 | 5/2016 | Ito et al. |
| 2017/0177922 A1 | 6/2017 | Pi |
| 2017/0200901 A1 | 7/2017 | Fujita et al. |

FOREIGN PATENT DOCUMENTS

| | | |
|---|---|---|
| KR | 1020160011038 A | 1/2016 |
| KR | 101755422 B1 | 7/2017 |

* cited by examiner

ORGANIC ELECTRONIC DEVICE AND METHOD OF FABRICATING THE SAME

CROSS-REFERENCE TO RELATED APPLICATIONS

This U.S. non-provisional patent application claims priority under 35 U.S.C. § 119 of Korean Patent Application Nos. 10-2017-0106936, filed on Aug. 23, 2017, 10-2017-0169604, filed on Dec. 11, 2017, and 10-2018-0052660, filed on May 8, 2018, the entire contents of which are hereby incorporated by reference.

BACKGROUND OF THE INVENTION

The present disclosure herein relates to organic electronic devices and methods of fabricating the same.

Recently, biometric devices, as a means to replace a conventional password system, have been used in the financial sector. Biometric means may include fingerprint or vein recognition. When advantages and disadvantages of the fingerprint and vein recognition are compared, the fingerprint recognition is advantageous in that it is the most widely used because time required for recognition is short and it is simple, but is disadvantageous in that it is easy to steal fingerprint recognition data. In contrast, the vein recognition is advantageous in that it is almost impossible to steal vein recognition data, but is disadvantageous in that the time required for recognition is longer than that of the fingerprint recognition and expensive equipment is needed.

For example, when a finger or hand is illuminated with a light source, electromagnetic waves are generated from the living body, and the vein recognition has an operating mechanism that senses the generated electromagnetic waves.

Recently, a significant amount of research related to biometric devices for the use in mobile devices, such as smartphones, has been conducted. With respect to the smartphones, a flexible type becomes mainstream.

SUMMARY OF THE INVENTION

The present disclosure provides a flexible biometric device with high efficiency.

The present disclosure also provides a method of fabricating a flexible organic electronic device.

An embodiment of the inventive concept provides an organic electronic device including: a flexible substrate configured to include a first region and a second region which are laterally spaced apart from each other; an organic light-emitting diode disposed in the first region of the flexible substrate; and a photodetector disposed in the second region of the flexible substrate, wherein the organic light-emitting diode and the photodetector are disposed on the same plane.

In an embodiment, the organic light-emitting diode may generate a first electromagnetic wave toward a living body, the living body may generate a second electromagnetic wave by receiving the first electromagnetic wave, and the photodetector may detect the second electromagnetic wave.

In an embodiment, the flexible substrate may be bent to face the living body, and an amount of the first electromagnetic wave received by the living body when the flexible substrate is bent may be greater than an amount of the first electromagnetic wave received by the living body when the flexible substrate is flat.

In an embodiment, the photodetector may include at least one of a photodiode configured to include a first conductive organic layer and a second conductive organic layer or a photo transistor configured to include a light absorbing layer.

In an embodiment, the organic electronic device may further include a first organic curved surface member disposed on the organic light-emitting diode.

In an embodiment, the organic electronic device may further include a color conversion layer disposed on the organic light-emitting diode.

In an embodiment, the organic electronic device may further include a second organic curved surface member disposed on the photodetector.

In an embodiment, the organic electronic device may further include a band filter layer disposed on the photodetector.

In an embodiment, the organic electronic device may further include a first transistor which is disposed in the first region of the flexible substrate and is for driving the organic light-emitting diode; and a second transistor which is disposed in the second region of the flexible substrate and is for driving the photodetector.

In an embodiment of the inventive concept, a method of fabricating an organic electronic device which includes: preparing a flexible substrate which includes a first region and a second region; sequentially stacking a first electrode, an organic emission layer, and a second electrode in the first region of the flexible substrate; and forming a photodetector in the second region of the flexible substrate.

In an embodiment, the forming of the photodetector may include sequentially stacking a third electrode, a first conductive organic layer, a second conductive organic layer, and a fourth electrode in the second region of the flexible substrate.

In an embodiment, the forming of the photodetector may include forming a fifth electrode in the second region of the flexible substrate; forming an insulating layer on the fifth electrode; forming a sixth electrode and a seventh electrode, which are spaced apart from each other, on the insulating layer; and forming a light absorbing layer between the sixth electrode and the seventh electrode.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION OF PREFERRED EMBODIMENTS

Figure 1:
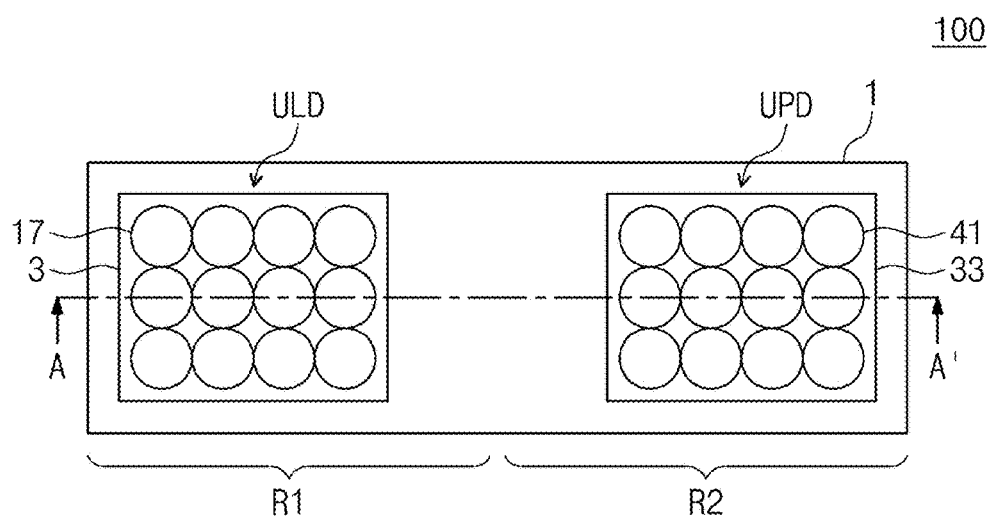
FIG. 1 is a plan view illustrating an organic electronic device according to embodiments of the inventive concept.

The foregoing and other objects, features and advantages of the present disclosure will become more readily apparent from the following detailed description of preferred embodiments of the present disclosure that proceeds with reference to the appending drawings. The present disclosure may, however, be embodied in different forms and should not be construed as limited to the embodiments set forth herein. Rather, these embodiments are provided so that this disclosure will be thorough and complete, and will fully convey the scope of the inventive concept to those skilled in the art.

It will be understood that when an element such as a layer, film, region, or substrate is referred to as being "on" another element, it can be directly on the other element or intervening elements may also be present. Additionally, in the figures, the dimensions of elements are exaggerated for clarity of illustration.

The embodiment in the detailed description will be described with sectional views as ideal exemplary views of the present invention. In the figures, the dimensions of layers and regions are exaggerated for clarity of illustration. Accordingly, shapes of the exemplary views may be modified according to manufacturing techniques and/or allowable errors. Therefore, the embodiments of the present invention are not limited to the specific shape illustrated in the exemplary views, but may include other shapes that may be created according to manufacturing processes. For example, an etched region illustrated as a rectangle may have rounded or curved features. Areas exemplified in the drawings have general properties, and are used to illustrate a specific shape of a device. Thus, this should not be construed as limited to the scope of the present invention. It will be understood that although the terms first and second are used herein to describe various elements, these elements should not be limited by these terms. These terms are only used to distinguish one element from another element. An embodiment described and exemplified herein includes a complementary embodiment thereof.

In the following description, the technical terms are used only for explaining a specific exemplary embodiment while not limiting the present invention. The terms of a singular form may include plural forms unless referred to the contrary. The meaning of "comprise" and/or "comprising" specifies a property, a region, a fixed number, a step, a process, an element and/or a component but does not exclude other properties, regions, fixed numbers, steps, processes, elements and/or components.

Hereinafter, exemplary embodiments of the inventive concept will be described in detail with reference to the accompanying drawings.

Figure 2:
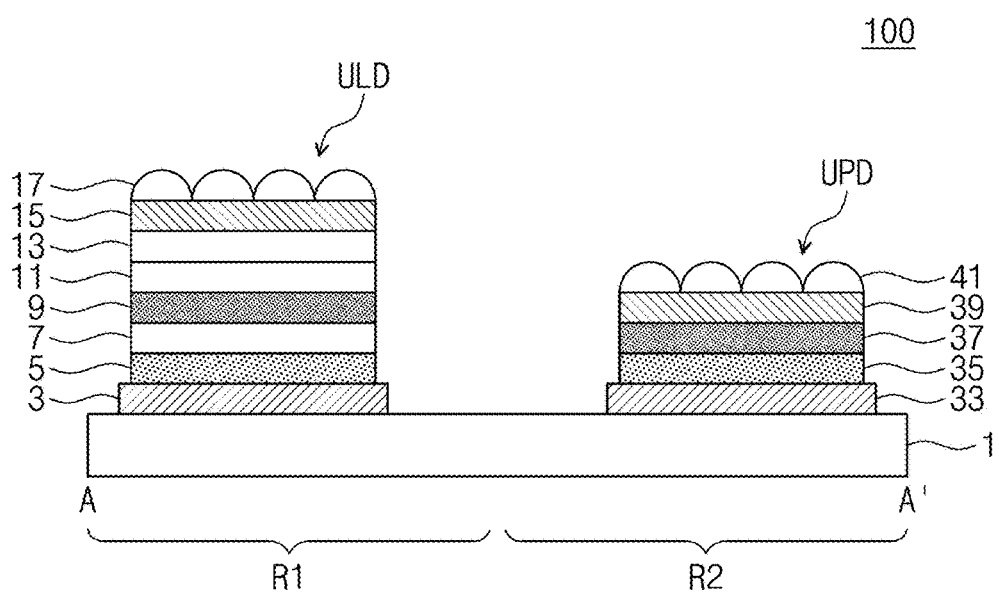
FIG. 2 is a cross-sectional view taken along line A-A' of FIG. 1.

FIG. 1 is a plan view illustrating an organic electronic device according to embodiments of the inventive concept. FIG. 2 is a cross-sectional view taken along line A-A' of FIG. 1.

Referring to FIGS. 1 and 2, an organic electronic device 100 according to embodiments of the inventive concept includes a substrate 1. The substrate 1 may include a first region R1 and a second region R2. The substrate 1 may include at least one material of glass, polyimide, or polyethylene naphthalene (PEN). If the substrate 1 is formed of only polyimide or PEN, the substrate 1 may be flexible. The substrate 1 may be named as a flexible substrate. The organic electronic device 100 may be named as a biometric device.

Subsequently, a unit light-emitting device ULD may be disposed in the first region R1 of the substrate 1. The unit light-emitting device ULD may be named as an organic light-emitting diode. A unit light-receiving device UPD may be disposed in the second region R2 of the substrate 1. For example, the unit light-receiving device UPD may be named as a photodetector. The unit light-emitting device ULD may include a first electrode 3, a hole injection layer 5, a hole transport layer 7, an emission layer 9, an electron transport layer 11, an electron injection layer 13, and a second electrode 15 which are sequentially stacked. As another example, an electron injection layer, an electron transport layer, an emission layer, a hole transport layer, and a hole injection layer may be sequentially provided between the first electrode 3 and the second electrode 15. Hereinafter, for the simplicity of the description, it will be described that the unit light-emitting device ULD includes the first electrode 3, the hole injection layer 5, the hole transport layer 7, the emission layer 9, the electron transport layer 11, the electron injection layer 13, and the second electrode 15 which are sequentially stacked, but the embodiments of the inventive concept are not limited thereto.

The emission layer 9 may be named as an organic emission layer. The first electrode 3, the hole injection layer 5, the hole transport layer 7, the emission layer 9, the electron transport layer 11, the electron injection layer 13, and the second electrode 15 may all be formed of a flexible material.

The first electrode 3 and the second electrode 15 may be formed of a thin film of metal, such as aluminum and copper, a thin film of conductive oxide, such as indium tin oxide (ITO) and indium zinc oxide (IZO), or an organic material such as PEDOT:PSS. Particularly, the second electrode 15 may include a structure in which a metal thin film and a conductive oxide thin film are alternatingly stacked. In this case, the metal thin film may have a thickness of about 5 nm to about 15 nm.

The hole injection layer 5, for example, may be formed of N,N'-diphenyl-N,N'-bis-[4-(phenyl-m-tolyl-amino)-phenyl]-biphenyl-4,4'-diamine (DNTPD), a phthalocyanine compound such as copper phthalocyanine, 4,4',4"-tris(3-methylphenyl phenylamino)triphenylamine (m-MTDATA), N,N'-di(1-naphthyl)-N,N'-diphenylbenzidine (NPB), TDATA, 2-TNATA, polyaniline/dodecylbenzenesulfonic acid (PANI/DBSA), poly(3,4-ethylenedioxythiophene)/poly (4-styrenesulfonate) (PEDOT/PSS), polyaniline/camphor sulfonic acid (PANI/CSA), or (polyaniline)/poly(4-styrenesulfonate) (PANI/PSS).

The hole transport layer 7, for example, may be formed of a carbazole-based derivative, such as N-phenyl carbazole and polyvinyl carbazole, N,N'-bis(3-methylphenyl)-N,N'-dipheny-[1,1-biphenyl]-4,4'-diamine (TPD), 4,4',4"-tris(N-carbazolyl)triphenylamine (TCTA), or N,N'-di(1-naphthyl)-N,N'-diphenylbenzidine (NPB).

The emission layer 9 may be formed of a polymer, such as any one of poly(p-phenylene vinylene) (PPV), poly(p-phenylene) (PPP), polythiophene (PT), polyfluorene (PF), poly(9.9-dioctylfluorene (PFO), and poly(9-vinylcarbazole) (PVK) and a derivative thereof, or a low molecular weight material including a metal complex such as tris(8-hydroxyquinolinato)aluminum (Alq3) as an aluminum (Al)-based complex, Ir(ppy)3(fac-tris(2-phenylpyridinato) iridium (III)) as an iridium (Ir)-based complex, or 2,3,7,8,12,13,17, 18-octaethyl-12H, 23H-porphyrine platinum (II) (PtOEP) as a platinum (Pt)-based complex. Also, a material, in which a low molecular weight phosphorescent material is added to poly(9-vinylcarbazole) (PVK) as a polymer, may also be used.

The electron transport layer 11 may be formed of a quinoline derivative.

The electron injection layer 13 may be formed of LiF, NaCl, CsF, $Li_2O$, or BaO.

The unit light-receiving device may include a third electrode 33, a first conductive organic layer 35, a second conductive organic layer 37, and a fourth electrode 39 which are sequentially stacked. All of the third electrode 33, the first conductive organic layer 35, the second conductive organic layer 37, and the fourth electrode 39 may be formed of a flexible material.

The third electrode 33 and the fourth electrode 39 may be formed of a thin film of metal, such as aluminum and copper, a thin film of conductive oxide, such as indium tin oxide (ITO) and indium zinc oxide (IZO), or an organic material such as PEDOT:PSS.

The first conductive organic layer 35 and the second conductive organic layer 37 may constitute a PN junction. That is, the first conductive organic layer 35 and the second conductive organic layer 37 may constitute a photodiode. Also, the photodiode may include the first conductive organic layer 35 and the second conductive organic layer 37. The first conductive organic layer 35 and the second conductive organic layer 37 may be composed of a conductive organic compound, and may have a pi conjugation. Any one of the first conductive organic layer 35 and the second conductive organic layer 37 may include a conductive organic compound having a low solid state ionization potential. The other one of the first conductive organic layer 35 and the second conductive organic layer 37 may include a conductive organic compound having high electron drift mobility, and may have an energy level that facilitates electron injection from the third electrode 33 or the fourth electrode 39.

The conductive organic compound having a low solid state ionization potential may include at least one of 4,4', 4"-tris(3-methylphenyl phenylamino)triphenylamine (m-MTDATA), 1,3,5-tris(diphenylamino)benzene (TDAB), 4,4'4"-tris(N,N-diphenylamino)triphenylamine (TDATA), 1,3,5-tris[4-(diphenylamino)phenyl]benzene (TDAPB), 4-diphenylaminobenzaldehyde diphenylhydrazone (DPH), copper(II) phthalocyanine (CuPc), poly(3,4-ethylenedioxythiophene) polystyrene sulfonate (PEDOT:PSS), or a conductive polymer.

The conductive organic compound having high electron drift mobility may include at least one of tris(8-quinolinolato)aluminum, a boron-containing composite, oxadiazole-containing oligo(arylene), an oligo(arylenevinylene)-based material, compounds with a benzene or triazine central core, compounds with a 1,3,5-triphenylbenzene or 2,4,6-triphenyltriazine central core, or triarylborane and silole derivatives.

The unit light-emitting device ULD may further include a first organic curved surface member 17 disposed on the second electrode 15. The first organic curved surface member 17 may be present in plurality and may be arranged in the form of an array. The single first organic curved surface member 17 may have a diameter of about 50 nm to about 1 µm. The unit light-receiving device UPD may further include a second organic curved surface member 41 disposed on the fourth electrode 39. The second organic curved surface member 41 may be present in plurality and may be arranged in the form of an array. The single second organic curved surface member 41 may have a diameter of about 50 nm to about 1 µm. The first and second organic curved surface members 17 and 41 may include benzene, naphthalene, phenanthrene, biphenyl, quinoline, fluorine, phenylpyrazole, phenanthroline, quinodimethane, quinoxaline, indolocarbazole, carbazole, spirobifluorene, pyridine, thiophene, dibenzothiophene, furan, diazafluoren, benzofuropyridine, triazine, antracene, pyrene, benzothiazolel, coumarine, quinacridone, phenylpyridine, oxadiazole, phenoxazine, or derivatives thereof. Specifically, the first and second organic curved surface members 17 and 41 may include at least one of N,N-di(1-naphthyl)-N,N-diphenyl-(1, 1-biphenyl)-4,4-diamine (NPB), tris-(8-hydroxyquinoline) aluminum (Alq3), or derivatives thereof. Each of the first and second organic curved surface members 17 and 41 may have a width and a height of about 50 nm or more to less than about 1 µm.

The unit light-emitting device ULD may be a top-emission organic light-emitting diode. The unit light-receiving device UPD may be an organic photodiode. Since the first and second conductive organic layers 35 and 37, which constitute the PN junction included in the unit light-receiving device UPD, include the organic compound, the first and second conductive organic layers 35 and 37 may have flexibility. Since all of the unit light-emitting device ULD, the unit light-receiving device UPD, and the substrate may be formed of a flexible material, the organic electronic device 100 may have flexibility. If the unit light-receiving device UPD has a silicon-based PN junction structure, the organic electronic device 100 may not have flexibility.

Also, since the unit light-emitting device ULD and the unit light-receiving device UPD are arranged side by side on the single substrate 1, the highly integrated organic electronic device 100 may be provided.

A method of fabricating the organic electronic device 100, which has been described with reference to FIGS. 1 and 2, is as follows. First, a flexible substrate 1 is prepared. A unit light-emitting device ULD may be provided by sequentially forming a first electrode 3, a hole injection layer 5, a hole transport layer 7, an emission layer 9, an electron transport layer 11, an electron injection layer 13, and a second electrode 15 in a first region R1 of the substrate 1. In addition, a unit light-receiving device UPD may be provided by sequentially forming a third electrode 33, a first conductive organic layer 35, a second conductive organic layer 37, and a fourth electrode 39 in a second region R2 of the substrate 1. The unit light-emitting device ULD and the unit light-receiving device UPD may each independently be prepared by performing deposition, coating, drying, and etching processes.

Alternatively, in a case in which some of configurations of the unit light-emitting device ULD are the same as configurations of the unit light-receiving device UPD, the unit light-emitting device ULD and the unit light-receiving device UPD may be formed at the same time. For example, the first electrode 3 and the third electrode 33, for example, may be simultaneously formed of the same material such as metal, ITO, or an organic material. The hole injection layer 5 and the first conductive organic layer 35, for example, may be simultaneously formed of the same material such as TDATA. The emission layer 9 and the second conductive organic layer 37, for example, may be simultaneously formed of the same material such as Alq3. The second electrode 15 and the fourth electrode 39, for example, may be simultaneously formed of the same material such as metal, ITO, or an organic material. The first and second organic curved surface members 17 and 41, for example, may be simultaneously formed of the same material such as NPB. Since the PN junction structure of the unit light-receiving device UPD may be formed of an organic compound, the organic compound may overlap with the constituent material of the unit light-emitting device ULD. Thus, since the unit light-emitting device ULD and the unit light-receiving device UPD may be formed at the same time, it is advantageous in that the process may be simplified.

Figure 3:
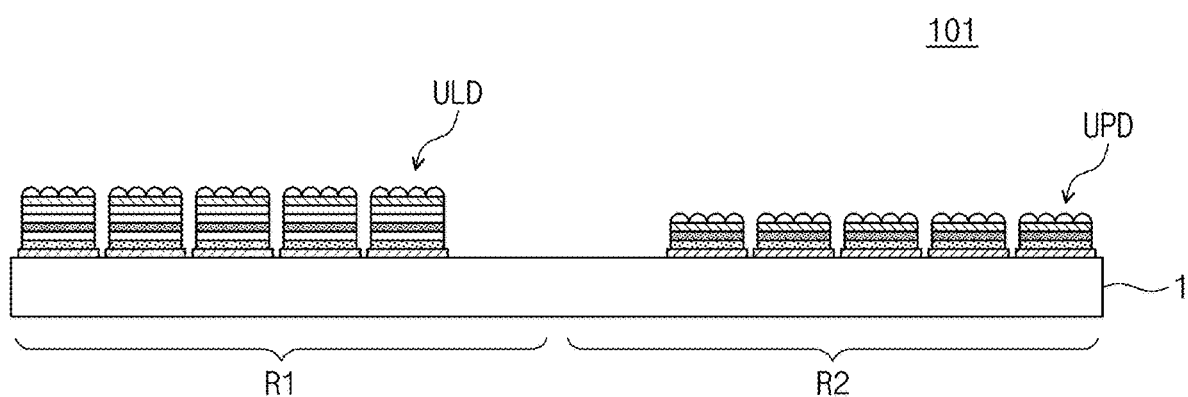
FIG. 3 is a cross-sectional view illustrating an organic electronic device according to embodiments of the inventive concept.

FIG. 3 is a cross-sectional view illustrating an organic electronic device according to embodiments of the inventive concept.

Referring to FIG. 3, in an organic electronic device 101 according to the present embodiment, a unit light-emitting device ULD may be disposed in plurality in a first region R1 and a unit light-receiving device UPD may be disposed in plurality in a second region R2. Other configurations may be the same as/similar to those described with reference to FIGS. 1 and 2.

Figure 4A:
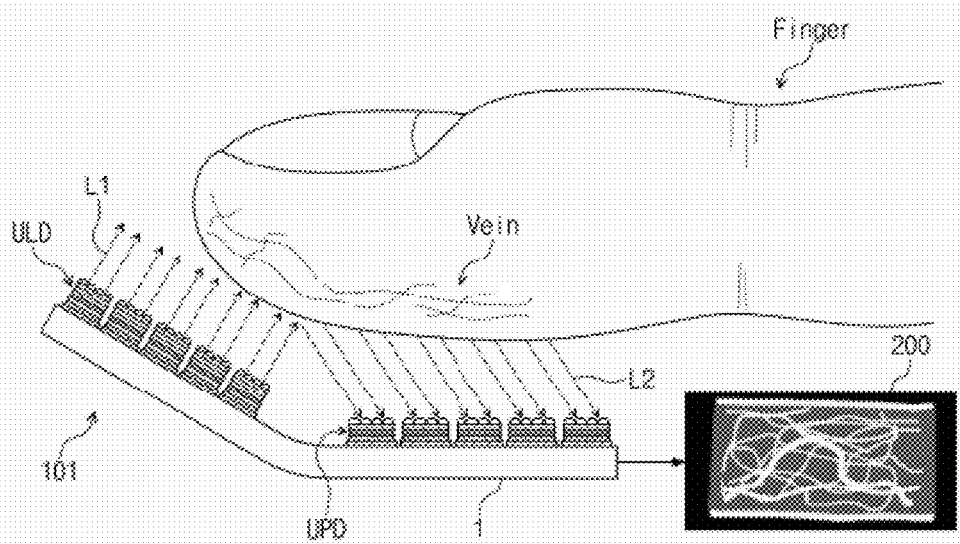
FIGS. 4A and 4B illustrate an operating principle of the organic electronic device according to the embodiments of the inventive concept.
Figure 4B:
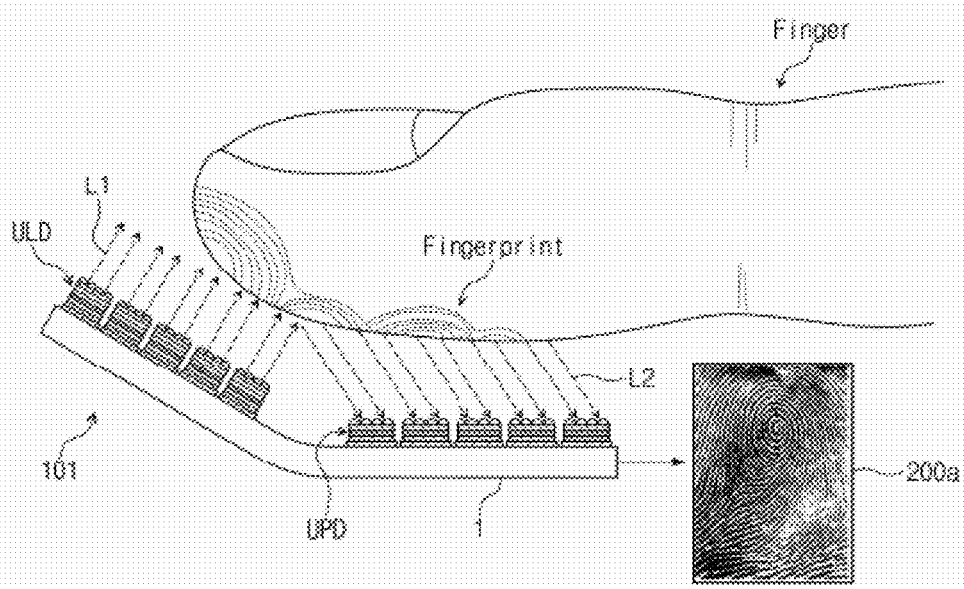

FIGS. 4A and 4B illustrate an operating principle of the organic electronic device according to the embodiments of the inventive concept.

Referring to FIGS. 4A and 4B, the unit light-emitting device ULD may generate a first electromagnetic wave L1 out of the second electrode 15 toward a living body. The first organic curved surface member 17 may play a role in generating/scattering more of the first electromagnetic wave L1 out of the second electrode 15. The living body, for example, may be a finger. The living body receiving the first electromagnetic wave L1 may generate a second electromagnetic wave L2. The substrate 1 is bent to face the living body, and an amount of the first electromagnetic wave L1 received by the living body when the substrate 1 is bent may be greater than an amount of the first electromagnetic wave L1 received by the living body when the substrate 1 is flat. The second electromagnetic wave L2, for example, may have finger vein or fingerprint image information. The second electromagnetic wave L2 may be detected by the unit light-receiving device UPD. The second organic curved surface member 41 may function to allow the second electromagnetic wave L2 to be absorbed by the first and second conductive organic layers 35 and 37. The first electromagnetic wave L1 may be visible light having a wavelength of about 380 nm or more to about 780 nm or less and/or infrared light having a wavelength of about 780 nm or more to about 5 μm or less. Since the second electromagnetic wave L2 is absorbed by the PN junction structure between the first and second conductive organic layers 35 and 37 of the unit light-receiving device UPD, a photoelectric effect may occur, and thus, living body image information 200 and 200a may be obtained by detecting charges generated by the photoelectric effect. In this case, since the organic electronic device 101 is flexible, it may be bent to match the shape of the living body, and thus, the amount of the first electromagnetic wave L1 toward the living body may be further increased. Therefore, the living body image information 200 and 200a may be more easily obtained.

Figure 5:
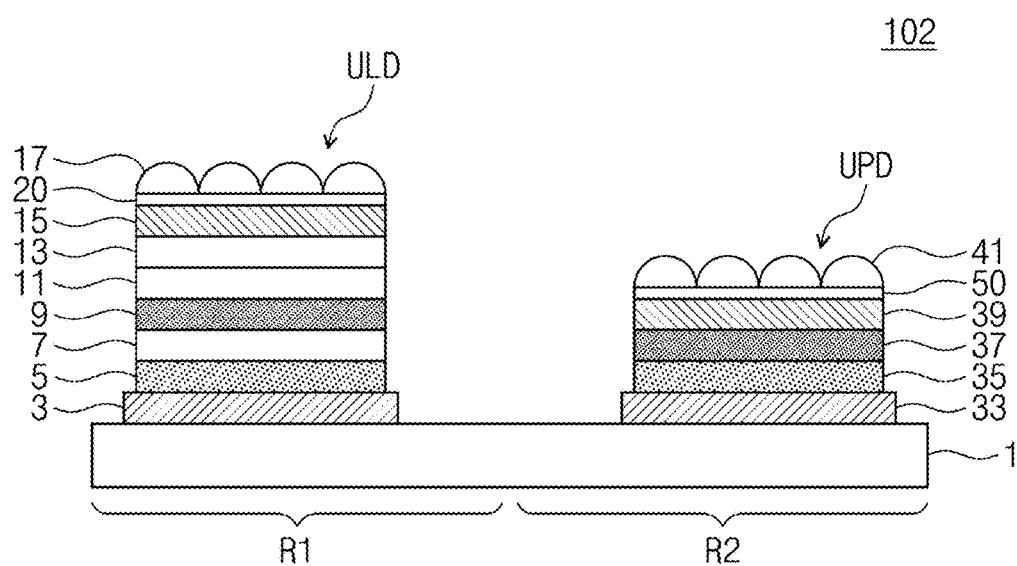
FIGS. 5 through 7 are cross-sectional views illustrating organic electronic devices according to embodiments of the inventive concept.
Figure 6:
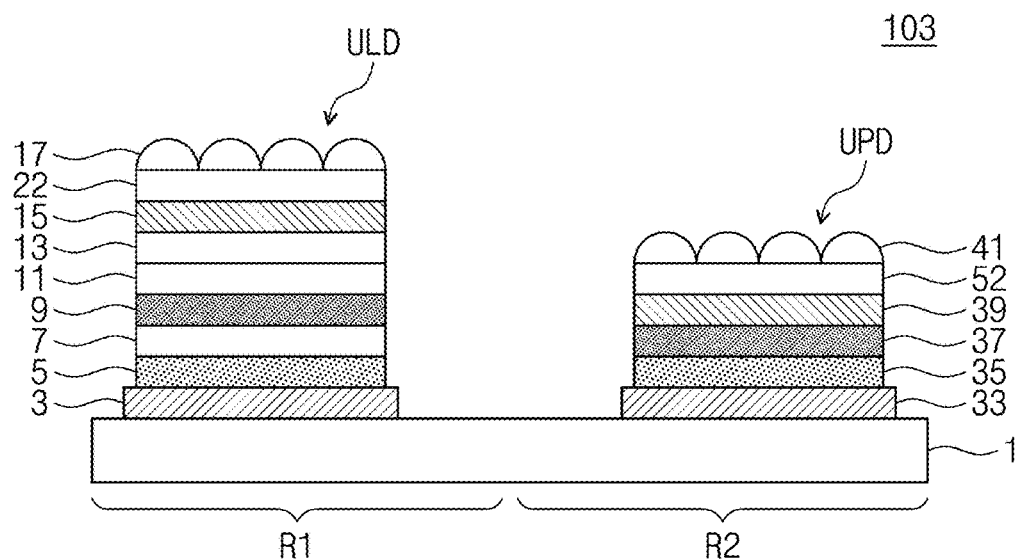
Figure 7:
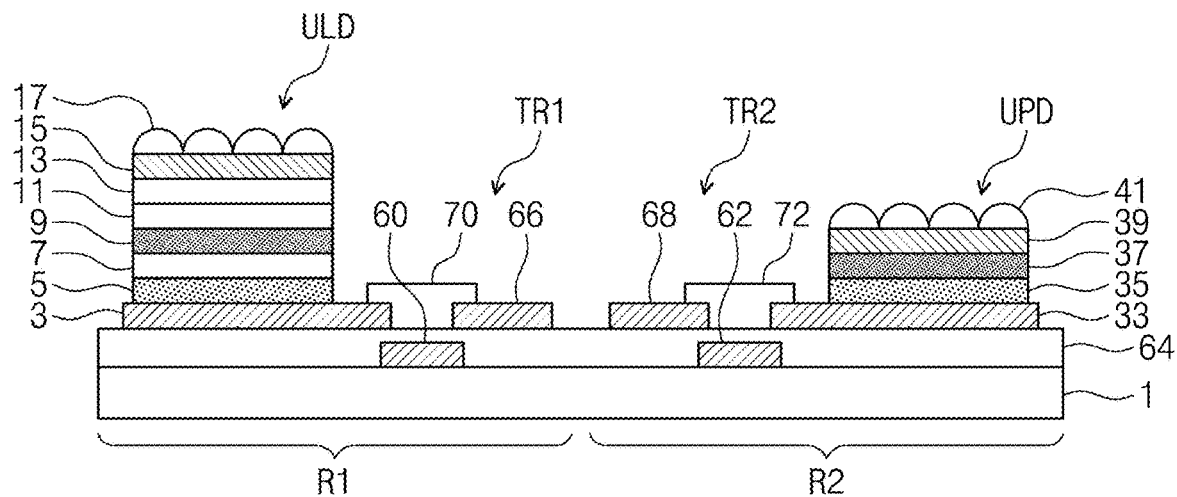

FIGS. 5 through 7 are cross-sectional views illustrating organic electronic devices according to embodiments of the inventive concept.

Referring to FIG. 5, in an organic electronic device 102 according to the present embodiment, a first oxide layer 20 may be disposed between a first organic curved surface member 17 and a second electrode 15. A second oxide layer 50 may be disposed between a second organic curved surface member 41 and a fourth electrode 39. In a case in which the second electrode 15 and the fourth electrode 39 are formed only of a metal, the formation of the first and second organic curved surface members 17 and 41 may be difficult. That is, since the metal has high surface energy, it may be difficult to form hemispherical droplets for the formation of the first and second organic curved surface members 17 and 41. Thus, in order to address this limitation, the first and second oxide layers 20 and 50 may be respectively disposed on the second electrode 15 and the fourth electrode 39. The first and second oxide layers 20 and 50 may be formed of an aluminum oxide layer, ITO, or IZO. In a case in which the first and second oxide layers 20 and 50 are formed of the aluminum oxide layer, the first and second oxide layers 20 and 50 are thinly formed to have a thickness of a few tens of nanometers, and thus, the first and second oxide layers 20 and 50 may be allowed to have flexibility. The first and second oxide layers 20 and 50 may be formed of the same material at the same time.

Referring to FIG. 6, in an organic electronic device 103 according to the present embodiment, a color conversion layer 22 may be disposed between a first organic curved surface member 17 and a second electrode 15. In addition, a band filter layer 52 may be disposed between a second organic curved surface member 41 and a fourth electrode 39. The color conversion layer 22 may include a quantum dot, an oxide including a rare earth element, a polymethine-based organic material, and a conjugated organic polymer material. The band filter layer 52 may transmit only light having a desired wavelength.

Referring to FIG. 7, an organic electronic device 104 according to the present embodiment may further include a first transistor TR1 which is disposed in a first region R1 of a substrate 1, is connected to a first electrode 3, and is for driving a unit light-emitting device ULD. The first transistor TR1 may include a first gate electrode 60 disposed in the first region R1 of the substrate 1, a gate insulating layer 64 configured to cover the first gate electrode 60 and the substrate 1, a first source/drain electrode 66 which is disposed on the gate insulating layer 64 and is spaced apart from the first electrode 3, and a first channel layer 70 which is disposed between the first electrode 3 and the first source/drain electrode 66 and is in contact with the gate insulating layer 64. The gate insulating layer 64 may extend to cover the substrate 1 of a second region R2. The first electrode 3 may be disposed on the gate insulating layer 64.

The first gate electrode 60 may be formed of a metal, conductive oxide, or organic material. The gate insulating layer 64, for example, may be provided by printing a solution, which includes a silicon oxide ($SiO_2$) precursor, such as polysilazane, polysiloxane, and tetraethyl orthosilicate, an aluminum oxide ($Al_2O_3$) precursor, such as trimethylaluminum, or a precursor of oxide having good insulation property such as zirconium oxide ($ZrO_2$) or titanium oxide ($TiO_2$), drying, and then performing a heat treatment. The first source/drain electrode 66 may be formed of a metal, conductive oxide, or organic material. The first channel layer 70, for example, may be formed of an organic semiconductor material such as pentacene.

The organic electronic device 104 according to the present embodiment may further include a second transistor TR2 which is disposed in the second region R2 of the substrate 1, is connected to a third electrode 33, and is for driving a unit light-receiving device UPD. The second transistor TR2 may include a second gate electrode 62 which is disposed in the second region R2 of the substrate 1 and is covered with the gate insulating layer 64, a second source/drain electrode 68 which is disposed on the gate insulating layer 64 and is spaced apart from the third electrode 33, and a second channel layer 72 which is disposed between the third electrode 33 and the second source/drain electrode 68 and covers the gate insulating layer 64. The third electrode 33 may be disposed on the gate insulating layer 64. The second gate electrode 62 and the second source/drain electrode 68 may be formed of a metal, conductive oxide, or organic material. The second channel layer 72 may also be formed of the same material as the first channel layer 70.

Both of the first transistor TR1 and the second transistor TR2 may be formed of a flexible material.

A method of fabricating the organic electronic device 104 of FIG. 7 is as follows. A substrate 1 including a first region R1 and a second region R2 is prepared. A first gate electrode 60 is disposed on the substrate 1 in the first region R1 and a second gate electrode 62 is disposed on the substrate 1 in the second region R2. A gate insulating layer 64 is disposed on an entire surface of the substrate 1. A first electrode 3 and a first source/drain electrode 66, which are spaced apart from each other, are disposed on the gate insulating layer 64 in the first region R1. A third electrode 33 and a second source/drain electrode 68, which are spaced apart from each other, are disposed on the gate insulating layer 64 in the second region R2. A first channel layer 70 is disposed between the first electrode 3 and the first source/drain electrode 66, and a second channel layer 72 is disposed between the third electrode 33 and the second source/drain electrode 68. A unit light-emitting device ULD may be provided by sequentially forming a hole injection layer 5, a hole transport layer 7, an emission layer 9, an electron transport layer 11, an electron injection layer 13, and a second electrode 15 on the first electrode 3. A unit light-receiving device UPD may be provided by sequentially forming a first conductive organic layer 35, a second conductive organic layer 37, and a fourth electrode 39 on the third electrode 33.

Figure 8:
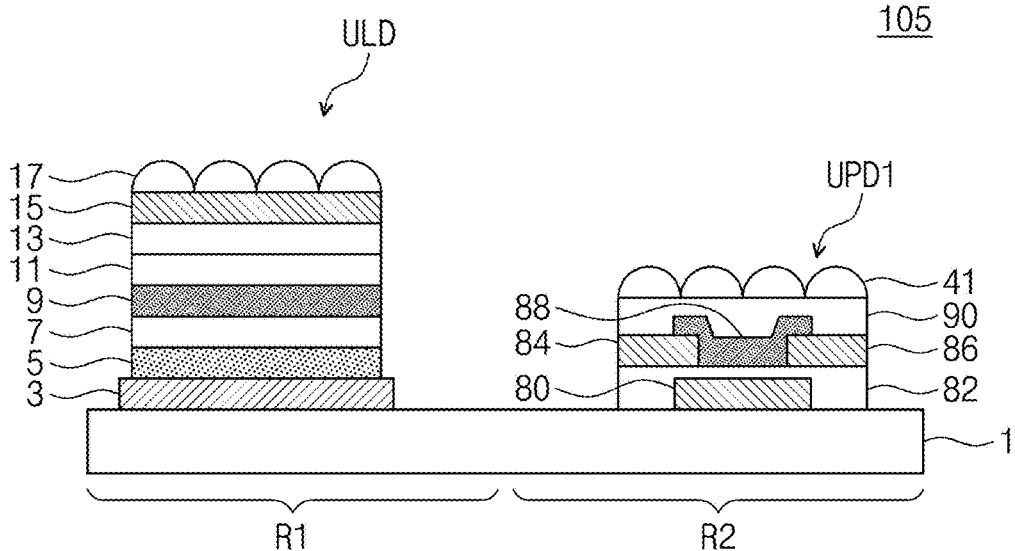
FIGS. 8 and 9 are cross-sectional views illustrating organic electronic devices according to embodiments of the inventive concept.
Figure 9:
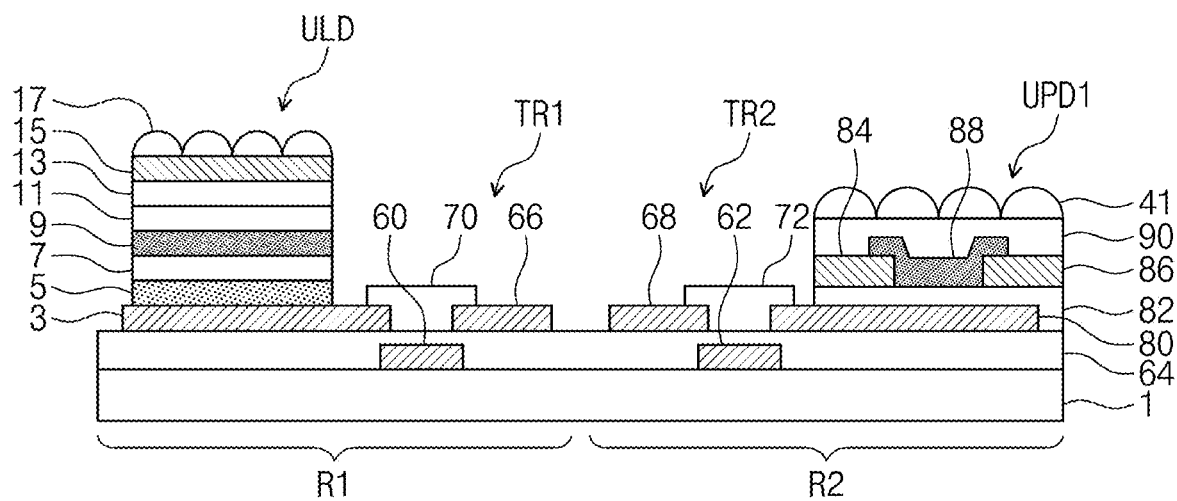

FIGS. 8 and 9 are cross-sectional views illustrating organic electronic devices according to embodiments of the inventive concept.

Referring to FIG. 8, in an organic electronic device 105 according to the present embodiment, a unit light-receiving device UPD1 may include a photo transistor. The unit light-receiving device UPD1 may include a fifth electrode 80, an insulating layer 82 configured to cover the fifth electrode 80, a sixth electrode 84 and a seventh electrode 86 which are disposed on the insulating layer 82 and are spaced apart from each other, and a light absorbing layer 88 disposed between the sixth electrode 84 and the seventh electrode 86. The light absorbing layer 88, the sixth electrode 84, and the seventh electrode 86 may be covered with a planarization layer 90. The planarization layer 90 may have a flat top surface. A second organic curved surface member 41 may be disposed on the planarization layer 90. The fifth to seventh electrodes 80, 84, and 86, for example, may be formed of a thin film of metal, such as copper, a thin film of conductive oxide, such as indium tin oxide (ITO) and indium zinc oxide (IZO), or an organic material such as PEDOT:PSS. Each of the insulating layer 82 and the planarization layer 90, for example, may be provided by printing a solution, which includes a silicon oxide ($SiO_2$) precursor, such as polysilazane, polysiloxane, and tetraethyl orthosilicate, an aluminum oxide ($Al_2O_3$) precursor, such as trimethylaluminum, or a precursor of oxide having good insulation property such as zirconium oxide ($ZrO_2$) or titanium oxide ($TiO_2$), drying, and then performing a heat treatment. The light absorbing layer 88 may generate charges, such as a hole and an electron, by absorbing light. The light absorbing layer 88 may be formed of copper phthalocyanine or pentacene. The fifth electrode 80 may function as a gate electrode of the photo transistor. The sixth electrode 84 and the seventh electrode 86 may function as source/drain electrodes of the photo transistor. Other structures may be the same as/similar to those described with reference to FIG. 2.

A process of fabricating the organic electronic device 105 of FIG. 8 is as follows. First, a unit light-emitting device ULD may be prepared in a first region R1 of the substrate 1 in the same manner as described with reference to FIG. 2. A unit light-receiving device UPD1 may be provided in a second region R2 of the substrate 1. A process of preparing the unit light-receiving device UPD1 is as follows. A fifth electrode 80 is disposed in the second region R2 of the substrate 1, and an insulating layer 82 configured to cover the fifth electrode 80 is disposed. A sixth electrode 84 and a seventh electrode 86, which are spaced apart from each other, are disposed on the insulating layer 82. A light absorbing layer 88 is disposed between the sixth electrode 84 and the seventh electrode 86. A planarization layer 90 configured to cover the light absorbing layer 88, the sixth electrode 84, and the seventh electrode 86 is disposed. A second organic curved surface member 41 is disposed on the planarization layer 90.

Referring to FIG. 9, in an organic electronic device 106 according to the present embodiment, the unit light-receiving device UPD1 described with reference to FIG. 8 and the second transistor TR2 described with reference to FIG. 7 may be disposed in a second region R2. Specifically, a second gate electrode 62 and a gate insulating layer 64 configured to cover the second gate electrode 62 may be disposed in the second region R2 of a substrate 1. A second source/drain electrode 68 and a fifth electrode 80 may be spaced part from each other and disposed on the gate insulating layer 64. A second channel layer 72 may be disposed between the second source/drain electrode 68 and the fifth electrode 80. A portion of the fifth electrode may be covered with an insulating layer 82. The insulating layer 82 may be spaced apart from the second channel layer 72. A sixth electrode 84 and a seventh electrode 86 may be disposed on the insulating layer 82. A light absorbing layer 88 may be disposed between the sixth electrode 84 and the seventh electrode 86. A planarization layer 90 and a second organic curved surface member 41 may be sequentially disposed on the light absorbing layer 88.

According to embodiments of the inventive concept, a flexible biometric device with high efficiency may be provided.

According to embodiments of the inventive concept, a flexible and highly integrated organic electronic device may be provided.

Although preferred embodiments of the present invention have been shown and described with reference to the accompanying drawings, it will be understood by those of ordinary skill in the art that various changes in form and details may be made therein without departing from the spirit and scope of the invention as defined by the following claims. Accordingly, it is to be understood that the inventive concept has been described by way of illustration and not limitation.

What is claimed is:
1. An organic electronic device comprising:
    a flexible substrate configured to include a first region and a second region which are laterally spaced apart from each other;
    an organic light-emitting diode disposed in the first region of the flexible substrate; and
    a photodetector disposed in the second region of the flexible substrate,
    wherein the organic light-emitting diode and the photodetector are disposed on a same plane, wherein the organic light-emitting diode generates a first electromagnetic wave toward a living body, wherein the living body generates a second electromagnetic wave by receiving the first electromagnetic wave, wherein the photodetector detects the second electromagnetic wave, wherein the flexible substrate is configured to be bent to face the living body, and wherein an amount of the first electromagnetic wave received by the living body when the flexible substrate is bent is greater than an amount of the first electromagnetic wave received by the living body when the flexible substrate is flat.

2. The organic electronic device of claim 1, wherein the photodetector comprises at least one of a photodiode configured to include a first conductive organic layer and a second conductive organic layer or a photo transistor configured to include a light absorbing layer.

3. The organic electronic device of claim 1, further comprising a first organic curved surface member disposed on the organic light-emitting diode.

4. The organic electronic device of claim 1, further comprising a color conversion layer disposed on the organic light-emitting diode.

5. The organic electronic device of claim 1, further comprising a second organic curved surface member disposed on the photodetector.

6. The organic electronic device of claim 1, further comprising a band filter layer disposed on the photodetector.

7. The organic electronic device of claim 1, further comprising a first transistor which is disposed in the first region of the flexible substrate and is for driving the organic light-emitting diode; and a second transistor which is disposed in the second region of the flexible substrate and is for driving the photodetector.

8. A method of fabricating an organic electronic device, the method comprising:

preparing a flexible substrate which includes a first region and a second region;

sequentially stacking a first electrode, an organic emission layer, and a second electrode in the first region of the flexible substrate; and forming a photodetector in the second region of the flexible substrate, wherein forming the photodetector comprises:

forming a fifth electrode in the second region of the flexible substrate;

forming an insulating layer on the fifth electrode;

forming a sixth electrode and a seventh electrode, which are spaced apart from each other, on the insulating layer; and forming a light absorbing layer between the sixth electrode and the seventh electrode.

9. The method of claim 8, wherein the forming of the photodetector comprises sequentially stacking a third electrode, a first conductive organic layer, a second conductive organic layer, and a fourth electrode in the second region of the flexible substrate.

* * * * *